(12) United States Patent
Terao

(10) Patent No.: US 10,751,930 B2
(45) Date of Patent: Aug. 25, 2020

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Tsutomu Terao, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 246 days.

(21) Appl. No.: 15/546,857

(22) PCT Filed: Mar. 7, 2016

(86) PCT No.: PCT/JP2016/001218
§ 371 (c)(1),
(2) Date: Jul. 27, 2017

(87) PCT Pub. No.: WO2016/166929
PCT Pub. Date: Oct. 20, 2016

(65) Prior Publication Data
US 2018/0022015 A1 Jan. 25, 2018

(30) Foreign Application Priority Data
Apr. 14, 2015 (JP) .................. 2015-082856

(51) Int. Cl.
*B29C 59/00* (2006.01)
*G03F 7/00* (2006.01)
(Continued)

(52) U.S. Cl.
CPC ............ *B29C 59/002* (2013.01); *B29C 59/02* (2013.01); *G03F 7/0002* (2013.01);
(Continued)

(58) Field of Classification Search
CPC . B29C 59/002; B29C 59/02; B29C 2059/023; B29C 2037/90; B29C 2037/903; B29C 2037/906; G03F 7/0002
See application file for complete search history.

(56) References Cited

U.S. PATENT DOCUMENTS 8,556,616 B2 10/2013 Resnick et al.
8,734,701 B2 5/2014 Kawakami
(Continued)

FOREIGN PATENT DOCUMENTS

CN 101884019 A 11/2010
CN 103129117 A 6/2013
(Continued)

OTHER PUBLICATIONS

Office Action issued in Japanese Appln. No. 2015-082856 dated Sep. 1, 2017.
(Continued)

*Primary Examiner* — Robert J Grun
(74) *Attorney, Agent, or Firm* — Rossi, Kimms & McDowell LLP

(57) ABSTRACT

The present invention an imprint apparatus which performs an imprint process of forming a pattern in an imprint material on a substrate using a mold, the apparatus including an image capturing unit configured to obtain an image by capturing the substrate, and a processing unit configured to perform detection processing of detecting a foreign particle present between the mold and the substrate, wherein the processing unit performs the detection processing by comparing, with a reference image, an image obtained by the image capturing unit in a state in which the mold and the imprint material on the substrate are in contact with each other, and when the image includes a region outside the
(Continued)

substrate, the region outside the substrate is excluded from a target of the detection processing.

13 Claims, 10 Drawing Sheets

(51) Int. Cl.
    *B29C 59/02*      (2006.01)
    *B29C 37/00*      (2006.01)

(52) U.S. Cl.
    CPC .... *B29C 2037/90* (2013.01); *B29C 2037/903* (2013.01); *B29C 2037/906* (2013.01); *B29C 2059/023* (2013.01)

(56) References Cited

U.S. PATENT DOCUMENTS

2009/0261504 A1    10/2009    Uchida
2015/0076724 A1    3/2015    Sato

FOREIGN PATENT DOCUMENTS

| | | |
|---|---|---|
| CN | 104281002 A | 1/2015 |
| JP | 2005214980 A | 8/2005 |
| JP | 2006294684 A | 10/2006 |
| JP | 2009536591 A | 10/2009 |
| JP | 2010149469 A | 7/2010 |
| JP | 2010203892 A | 9/2010 |
| JP | 2011003616 A | 1/2011 |
| JP | 2011240662 A | 12/2011 |
| JP | 5455583 B2 | 3/2014 |
| JP | 2015018997 A | 1/2015 |
| JP | 2015050217 A | 3/2015 |
| JP | 2015056589 A | 3/2015 |
| WO | 2015045348 A1 | 4/2015 |

OTHER PUBLICATIONS

Office Action issued in Chinese Appln. No. 201680021127.9 dated Mar. 16, 2020. English translation provided.

International Search Report issued in Intl. Appln. No. PCT/JP2016/001218 dated Jun. 7, 2016.

Written Opinion issued in Intl. Appln. No. PCT/JP2016/001218 dated Jun. 7, 2016.

[Fig. 1]
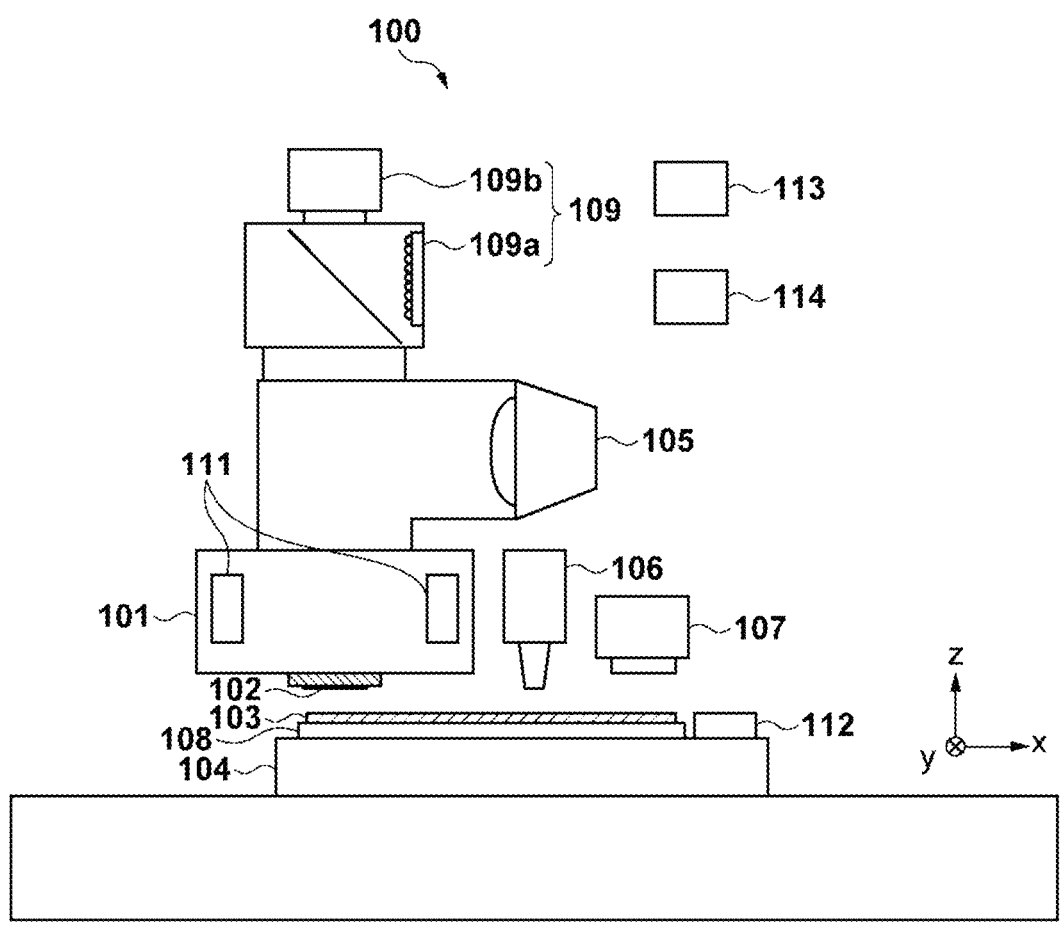

[Fig. 2A]
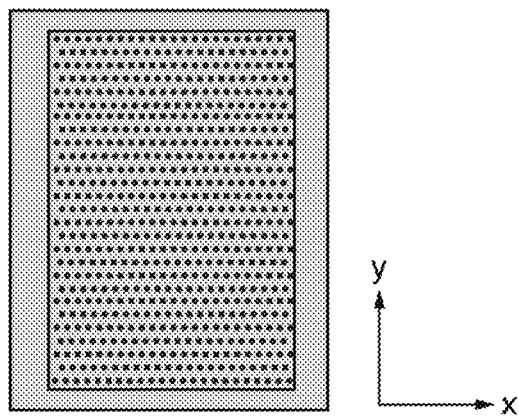
[Fig. 2B]
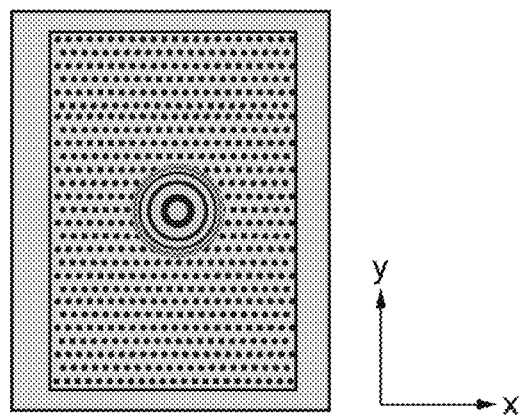
[Fig. 2C]
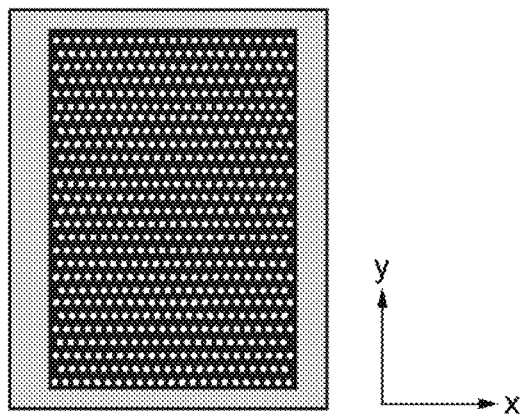

[Fig. 2D]
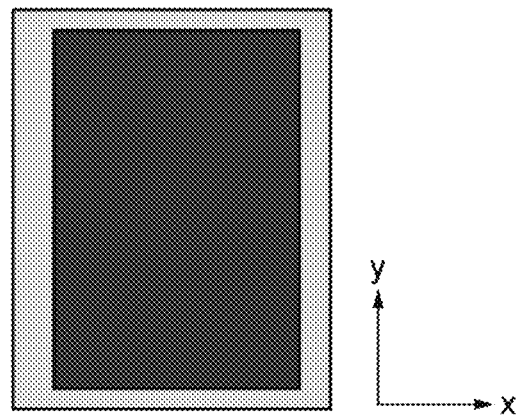
[Fig. 2E]
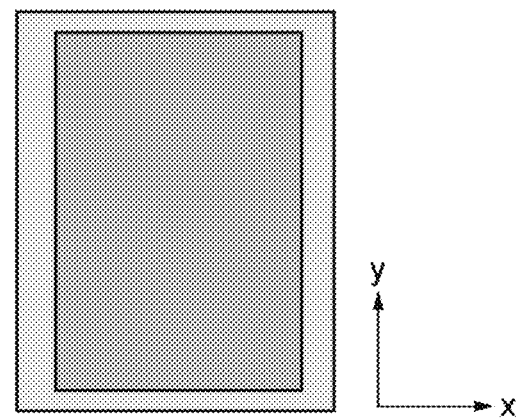
[Fig. 2F]
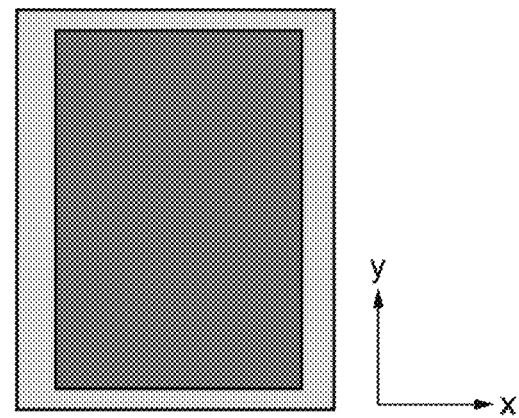

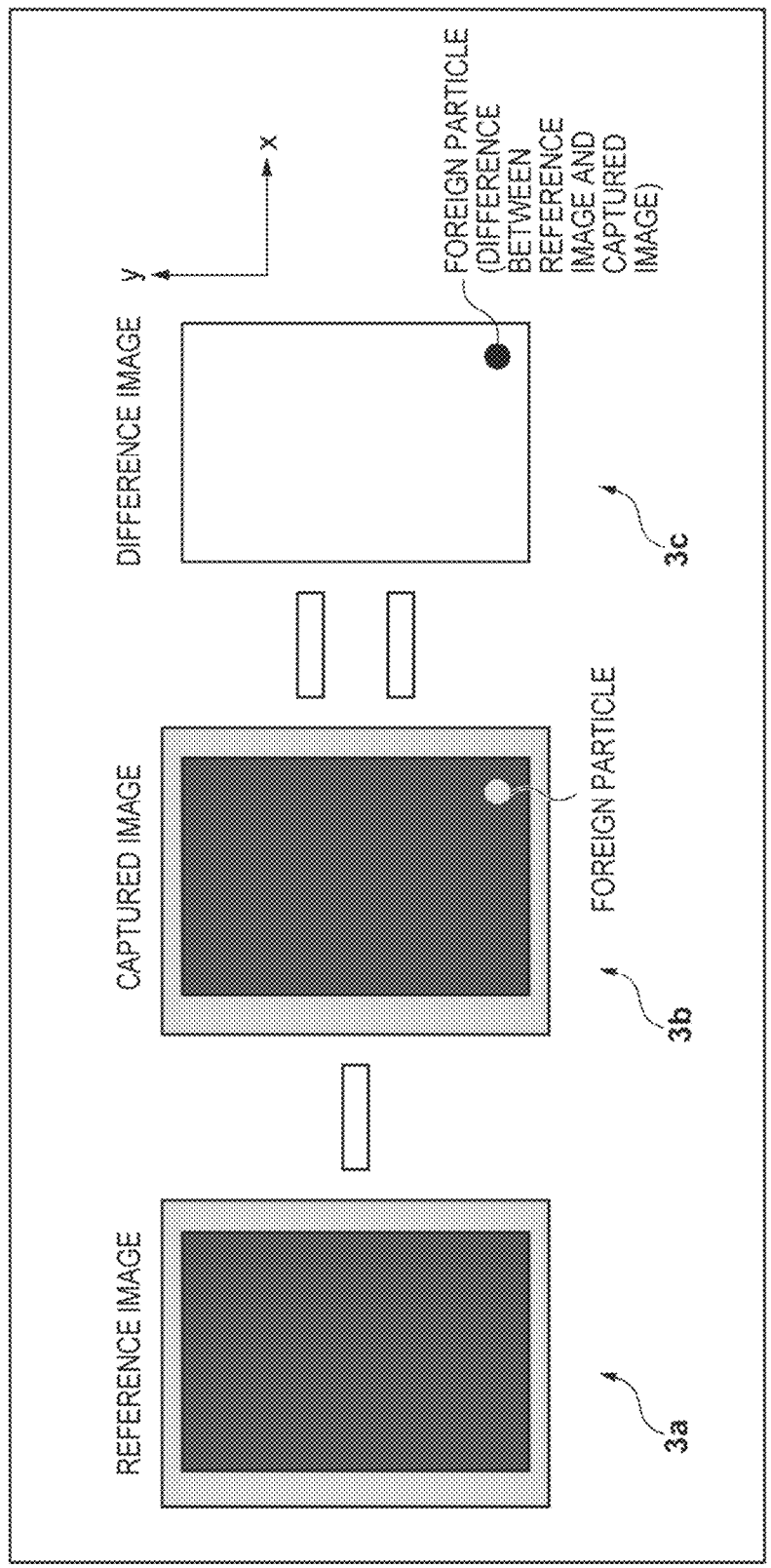

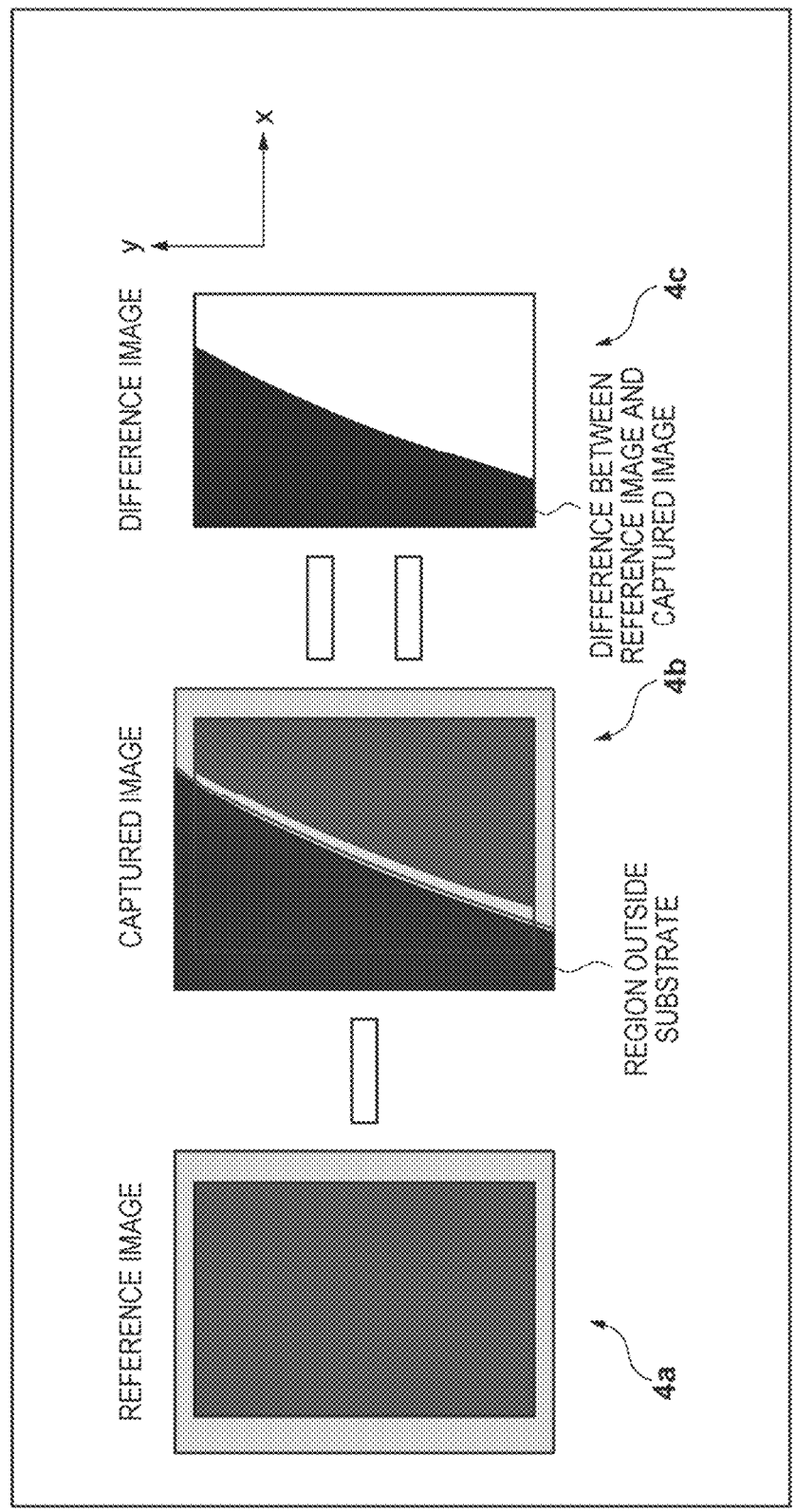

[Fig. 5]
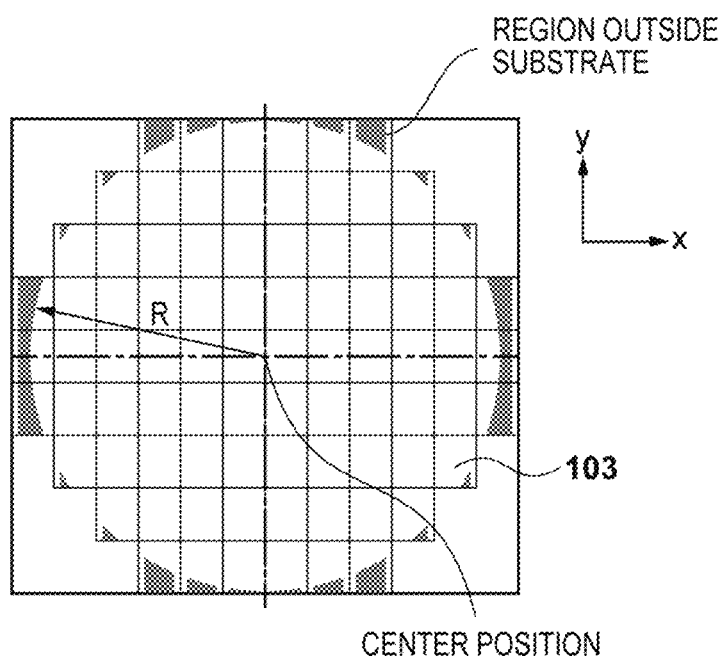

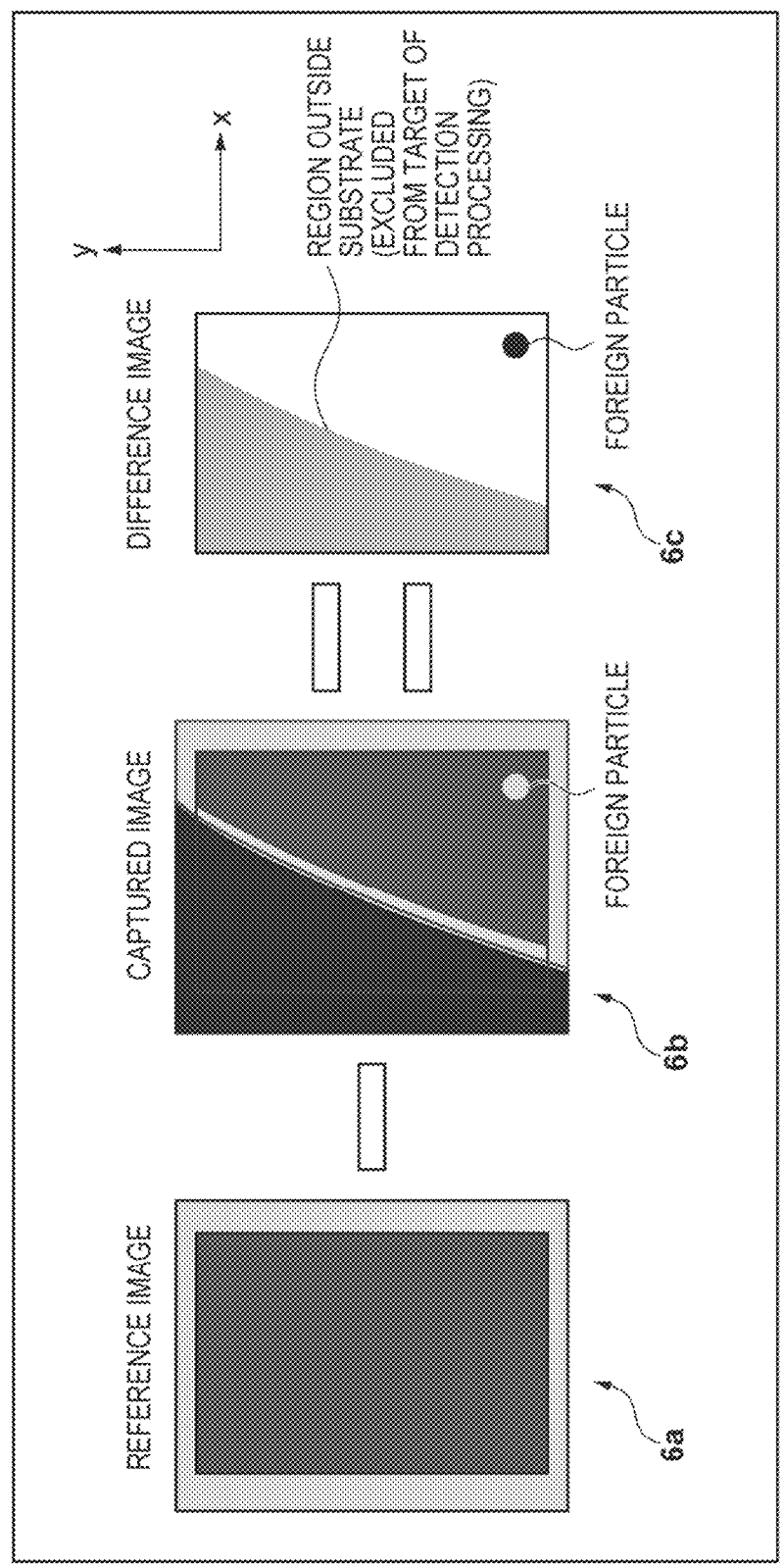

[Fig. 7A]
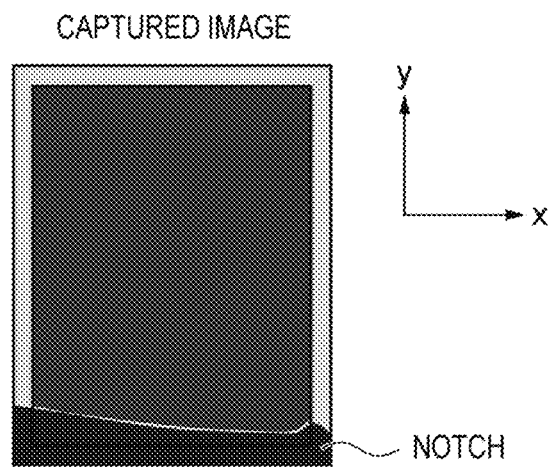
[Fig. 7B]
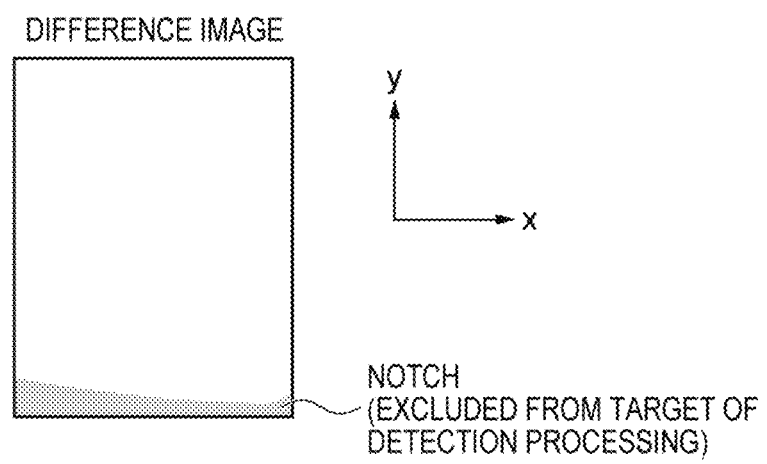

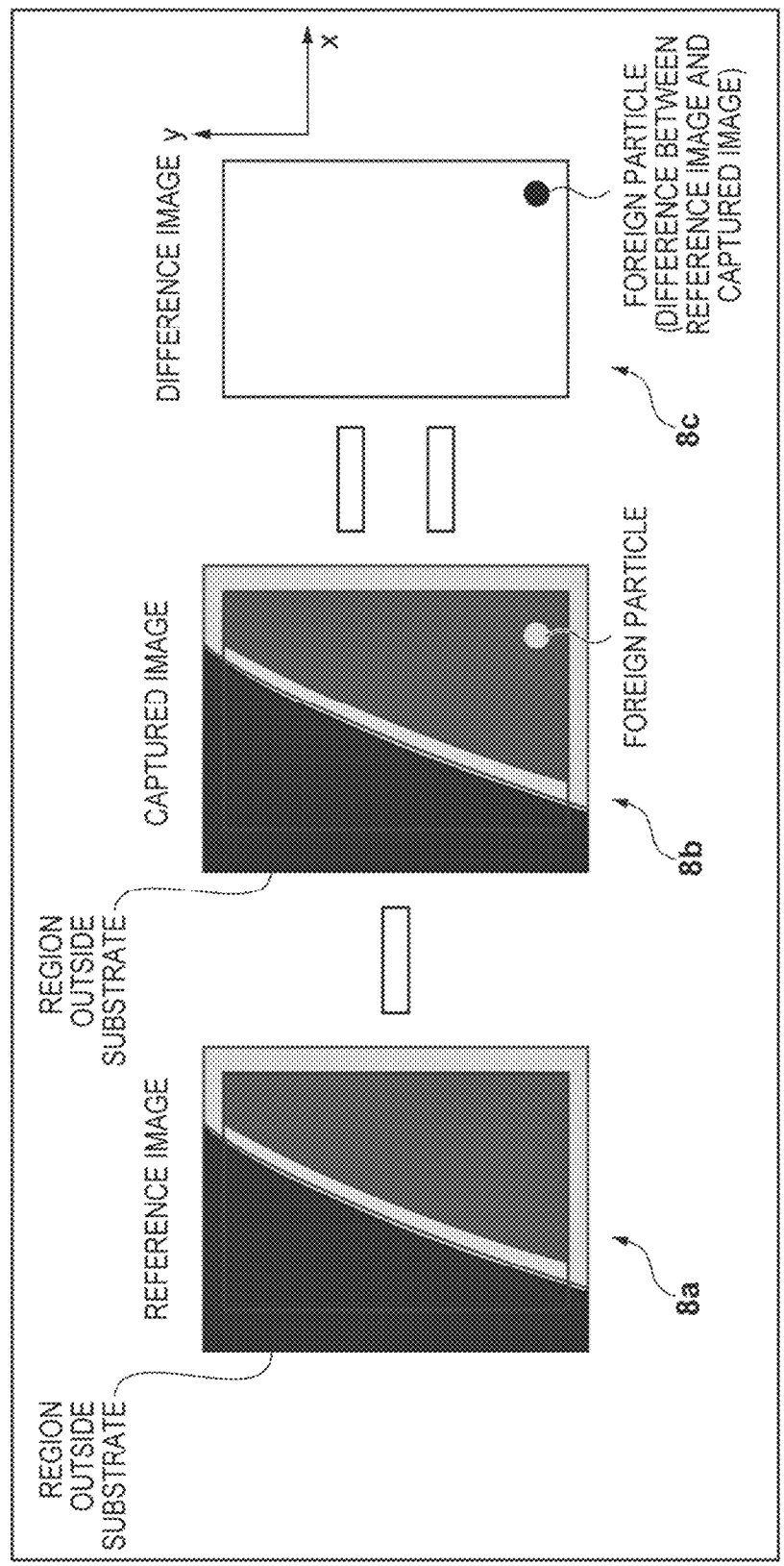

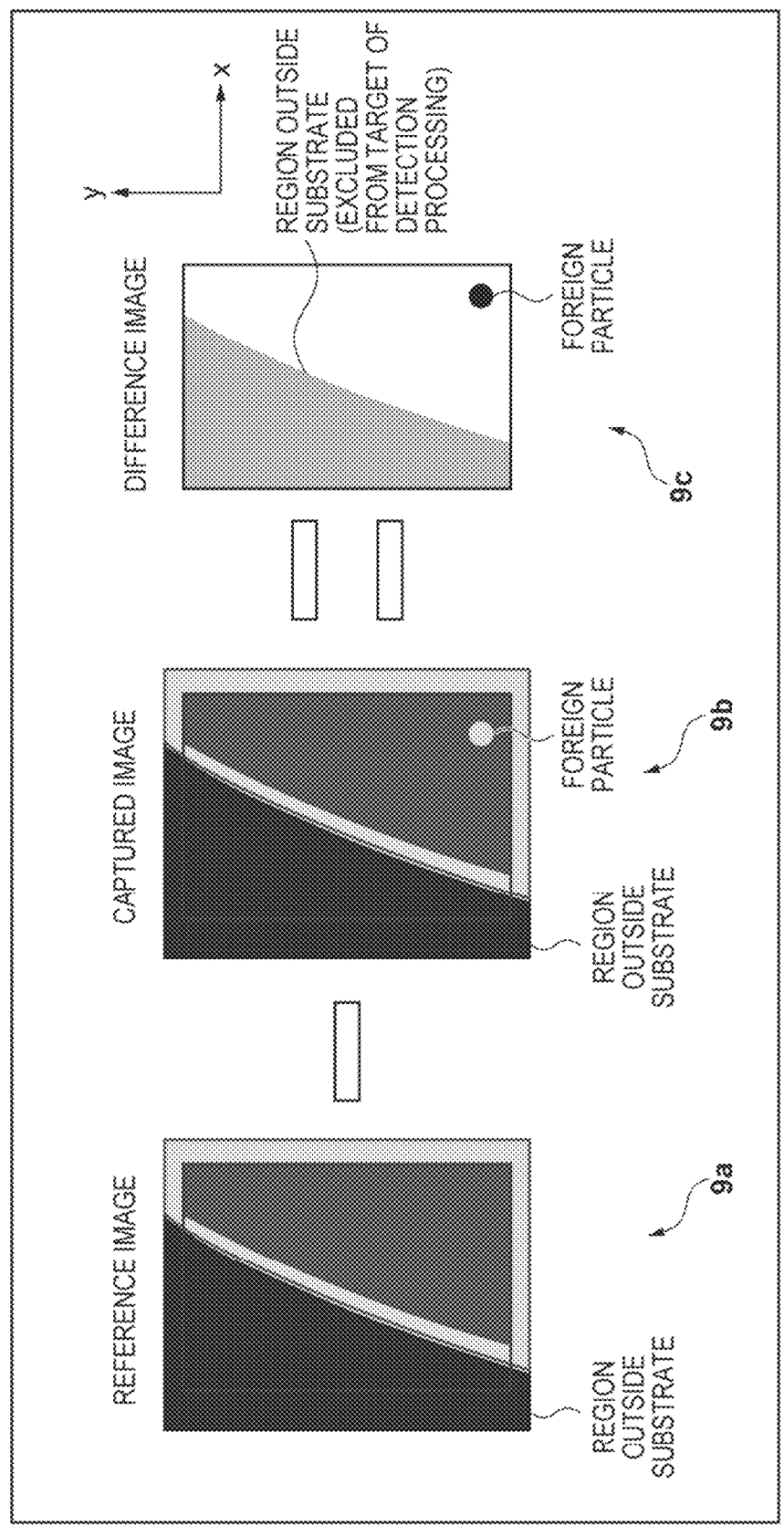

IMPRINT APPARATUS, IMPRINT METHOD, AND METHOD OF MANUFACTURING ARTICLE

TECHNICAL FIELD

The present invention relates to an imprint apparatus, an imprint method, and a method of manufacturing an article.

BACKGROUND ART

An imprint technique is a technique capable of forming a nanoscale fine pattern on a substrate and is attracting attention as one of lithography techniques for mass-producing magnetic storage media, semiconductor devices, and the like. As disclosed in Japanese Patent Laid-Open No. 2009-536591, an imprint apparatus using the imprint technique forms a pattern on the substrate by curing an imprint material (resin material) on the substrate in a state in which the imprint material and a mold on which a pattern has been formed are in contact with each other, and releasing the mold from the cured imprint material.

In the imprint apparatus, if a foreign particle is present between the mold and the substrate or the foreign particle (for example, the remaining imprint material) adheres to the mold when bringing the mold and the imprint material into contact with each other, a defect may occur in the pattern formed on the substrate. To cope with this, Japanese Patent Laid-Open No. 2011-003616 has proposed an imprint apparatus having a function of detecting such a defect in the pattern. Japanese Patent Laid-Open No. 2011-003616 has disclosed a technique of detecting the defect in the pattern based on the difference between an image obtained by capturing a pattern that has been formed on the substrate in an imprint process and a reference image prepared by capturing, in advance, a pattern (without the defect occurring) that has been formed normally on the substrate.

The technique disclosed in Japanese Patent Laid-Open No. 2011-003616 is advantageous in determining whether the defect occurs in the pattern formed on the substrate. However, the imprint apparatus requires, in order to increase its productivity, a technique for preventing the defect from occurring in the pattern formed on the substrate before it happens. Particularly, if the imprint process is continued in a state in which the foreign particle is present between the mold and the substrate or the foreign particle adheres to the mold, the foreign particle may also be sandwiched between the mold and substrate, thus damaging the mold.

SUMMARY OF INVENTION

The present invention provides an imprint apparatus advantageous in detecting a foreign particle present between a mold and a substrate.

According to one aspect of the present invention, there is provided an imprint apparatus which performs an imprint process of forming a pattern in an imprint material on a substrate using a mold, the apparatus including an image capturing unit configured to obtain an image by capturing the substrate, and a processing unit configured to perform detection processing of detecting a foreign particle present between the mold and the substrate, wherein the processing unit performs the detection processing by comparing, with a reference image, an image obtained by the image capturing unit in a state in which the mold and the imprint material on the substrate are in contact with each other, and when the image includes a region outside the substrate, the region outside the substrate is excluded from a target of the detection processing.

Further aspects of the present invention will become apparent from the following description of exemplary embodiments with reference to the attached drawings.

BRIEF DESCRIPTION OF DRAWINGS

FIG. 1 is a schematic view showing the arrangement of an imprint apparatus according to an aspect of the present invention.

FIG. 2A is a view schematically showing an image obtained by an image capturing unit of the imprint apparatus shown in FIG. 1.

FIG. 2B is a view schematically showing an image obtained by an image capturing unit of the imprint apparatus shown in FIG. 1.

FIG. 2C is a view schematically showing an image obtained by an image capturing unit of the imprint apparatus shown in FIG. 1.

FIG. 2D is a view schematically showing an image obtained by an image capturing unit of the imprint apparatus shown in FIG. 1.

FIG. 2E is a view schematically showing an image obtained by an image capturing unit of the imprint apparatus shown in FIG. 1.

FIG. 2F is a view schematically showing an image obtained by an image capturing unit of the imprint apparatus shown in FIG. 1.

FIG. 3 is view for explaining detection processing in an imprint process.

FIG. 4 is view for explaining a detection error of a foreign particle generated by detection processing in a partial field.

FIG. 5 is a view for explaining a region outside a substrate.

FIG. 6 is view for explaining detection processing in the partial field.

FIG. 7A is a view for explaining detection processing in a shot region having a notch.

FIG. 7B is a view for explaining detection processing in a shot region having a notch.

FIG. 8 is view for explaining detection processing in a partial field.

FIG. 9 is view for explaining detection processing in the partial field.

DESCRIPTION OF EMBODIMENTS

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the arrangement of an imprint apparatus 100 according to an aspect of the present invention. The imprint apparatus 100 is a lithography apparatus which forms a pattern in an imprint material on a substrate using a mold. The imprint apparatus 100 performs an imprint process of forming the pattern on the substrate by curing the imprint material on the substrate in a state in which the mold and the imprint material are in contact with each other, and releasing the mold from the cured imprint material. In this embodiment, a case will be described in which an ultraviolet-curing resin material which is cured by irradiation with ultraviolet rays is used as the imprint material. However, the imprint material may be a thermoplastic resin material or a thermosetting resin material.

The imprint apparatus 100 includes a mold stage 101 which moves while holding a mold 102, a substrate stage 104 which moves while holding a substrate 103, a light source 105 which emits the ultraviolet rays, and a resin supply unit 106 which supplies (applies) the ultraviolet-curing resin material onto the substrate. The imprint apparatus 100 also includes an off-axis alignment scope 107, a substrate chuck 108 which is arranged on the substrate stage and fixes the substrate 103, an image capturing unit 109, and on-axis alignment scopes 111. The imprint apparatus 100 further includes a reference plate 112 arranged on the substrate stage 104, a storage unit 113, and a processing unit 114.

The image capturing unit 109 includes an image capturing light source 109a and an image sensor 109b. The image capturing unit 109 captures a shot region of the substrate 103 and obtains an image via the mold 102 or without going through the mold 102. The image capturing light source 109a illuminates the substrate 103 (shot region) with light having a wavelength different from those of the ultraviolet rays, that is, light (for example, visible light) having a wavelength different from the induced wavelength of a photo-curable resin material. The image sensor 109b includes, for example, a CCD image sensor or a CMOS image sensor, and detects light reflected by the pattern surface of the mold 102 and the surface of the substrate 103. The image sensor 109b also detects interference light between (an interference pattern formed by) light reflected by the mold 102 and light reflected by the substrate 103.

The storage unit 113 includes, for example, a memory or a hard disk (HDD), and stores an image obtained by the image capturing unit 109 and a reference image used in detection processing to be described later. The storage unit 113 can also store various kinds of programs, data, information, and the like used in the imprint apparatus 100.

The processing unit 114 includes, for example, a CPU and a memory and performs the imprint process by controlling the respective units of the imprint apparatus 100. The processing unit 114 also performs detection processing of detecting a foreign particle present between the mold 102 and the substrate 103. In this embodiment, for example, the foreign particle sandwiched between the mold 102 and the substrate 103 is detected when bringing the mold 102 and a resin material on the substrate 103 into contact with each other while performing the imprint process.

First, the substrate 103 is caused to hold the substrate stage 104 in the imprint process. Next, the off-axis alignment scope 107 detects a mark provided on the substrate 103 and a mark provided in the reference plate 112, thereby obtaining the position and shape shift amounts between the substrate 103 and the substrate stage 104. Then, the on-axis alignment scopes 111 detect a mark provided in the mold 102 and the mark provided in the reference plate 112, thereby obtaining the position and shape shift amounts between the mold 102 and the substrate stage 104. Based on thus obtained position and shape shift amounts, position and shape shifts between the mold 102 and the substrate 103 are corrected (that is, alignment between the mold 102 and the substrate 103 is performed). Note that each on-axis alignment scope 111 is a scope which detects the mark formed on the substrate 103 via the mold 102 and the off-axis alignment scope 107 is a scope which detects the mark formed on the substrate 103 without going through the mold 102.

After the position and shape shifts between the mold 102 and the substrate 103 are corrected, the resin supply unit 106 supplies a resin material to the shot region on the substrate 103. Then, the mold stage 101 which holds the mold 102 is moved to bring the mold 102 and the resin material on the substrate 103 (shot region) into contact with each other. After the concave portion of the pattern surface of the mold 102 is filled with the resin material, the light source 105 irradiates the resin material on the substrate 103 with the ultraviolet rays via the mold 102, thereby curing the resin material. Then, the mold stage 101 is moved to release the mold 102 from the cured resin on the substrate 103. As a result, the pattern of the resin material is formed on the substrate 103 (shot region).

While the imprint process is performed, and more specifically, while the mold 102 and the resin material on the substrate 103 are in contact with each other, the image capturing unit 109 can capture a process in which the resin material on the substrate 103 fills the concave portion of the pattern surface while spreading between the mold 102 and the substrate 103. The image obtained by the image capturing unit 109 is thus stored in the storage unit 113, as described above.

FIGS. 2A to 2F are views each schematically showing an image obtained by the image capturing unit 109 while performing the imprint process. FIG. 2A shows the image obtained by capturing the substrate 103 to which the resin material has been supplied from the resin supply unit 106 using the image capturing unit 109 in a state in which the substrate 103 is moved under the mold 102. FIG. 2B shows the image obtained by capturing the substrate 103 using the image capturing unit 109 in a state in which the mold 102 (the pattern surface thereof) is deformed into a convex shape on a substrate side, and a part (center portion) of the mold 102 and the resin material on the substrate 103 are in contact with each other. A gap is generated between the mold 102 and the substrate 103 by gradually contacting, with the resin material on the substrate 103, the mold 102 from its center portion to its peripheral portion, as described above. An interference pattern, that is, Newton's ring pattern is observed, as shown in FIG. 2B.

FIG. 2C shows the image obtained by capturing the substrate 103 using the image capturing unit 109 in a state in which the mold 102 and the resin material on the substrate 103 are in contact with other in an entire region. In this state, however, the concave portion of the pattern surface of the mold 102 is not filled with the resin material, and thus bubbles are observed as shown in FIG. 2C. FIG. 2D shows the image obtained by capturing the substrate 103 using the image capturing unit 109 in a state in which the concave portion of the pattern surface of the mold 102 is completely filled with the resin material, that is, in a state immediately before the light source 105 emits the ultraviolet rays. In this state, as shown in FIG. 2D, the Newton's rings and the bubbles as shown in FIGS. 2B and 2C are not observed.

FIG. 2E shows the image obtained by capturing the substrate 103 using the image capturing unit 109 in a state in which the light source 105 irradiates the resin material on the substrate 103 with the ultraviolet rays via the mold 102. FIG. 2F shows the image obtained by capturing the substrate 103 using the image capturing unit 109 in a state in which the mold 102 is released from the cured resin on the substrate 103.

In the imprint apparatus 100, various factors cause the defect in the pattern formed on the substrate 103. It is possible, however, to reduce (prevent) occurrence of the defect in the pattern formed on the substrate 103 using the images shown in FIGS. 2A to 2D, that is, the images obtained by the image capturing unit 109 while performing the imprint process.

For example, in the image shown in FIG. 2A, it is possible to observe the array of the resin material (droplets thereof) supplied from the resin supply unit 106. It is therefore possible to detect, using the image shown in FIG. 2A, the abnormal array of the resin material to be a cause of the defect in the pattern, that is, the abnormal drop of the resin supply unit 106. More specifically, it is possible to detect the abnormal drop by comparing the image (the array of the droplets of the resin material) shown in FIG. 2A with the reference image (that is, the reference array of the resin material) obtained when the resin supply unit 106 supplies the droplets of the resin material normally. When such an abnormal drop is detected, it is effective, for reducing occurrence of the defect in the pattern, to supply the resin material onto the substrate 103 again by, for example, carrying out maintenance or exchange of the resin supply unit 106.

In the image shown in FIG. 2B, the Newton's rings can be observed as described above. This makes it possible to detect the parallelness between the mold 102 and the substrate 103 from the shapes and the positions of the Newton's rings. If the mold 102 and the substrate 103 are not parallel to each other, each Newton's ring is not a perfect circle or the center of Newton's rings does not match that of the image. In this case, it is effective, for reducing occurrence of the defect in the pattern, to improve the parallelness between the mold 102 and the substrate 103 by, for example, correcting the tilt of the mold 102.

It is also possible, to be described later, to detect the foreign particle sandwiched between the mold 102 and the substrate 103 using the images shown in FIGS. 2C and 2D. Such a sandwiched foreign particle not only causes the defect in the pattern formed on the substrate 103 but also damages the mold 102. Therefore, when the sandwiched foreign particle is detected, it is effective, for reducing occurrence of the defect in the pattern and damage to the mold, to cease the imprint process. For example, when the foreign particle is detected, the mold 102 is released from the resin material on the substrate 103 without curing the resin material. Also, the substrate 103 may be processed by storing information on the shot region where the foreign particle has been detected (the position of the foreign particle), and then using stored information in a step after the imprint process. For example, the shot region where the foreign particle has been detected is stored as an error region.

As described above, it is possible to reduce, using the images shown in FIGS. 2A to 2D, occurrence of the defect in the pattern having a different cause in accordance with a timing while performing the imprint process. Note that as in a technique disclosed in Japanese Patent Laid-Open No. 2011-003616, it is also possible to determine whether the defect occurs in the pattern on the substrate 103 by comparing the image shown in FIG. 2F with the reference image obtained from the pattern where no defect occurs.

In the imprint apparatus 100, detection processing of detecting the foreign particle present between the mold 102 and the substrate 103 is particularly performed in order to reduce occurrence of the defect in the pattern formed on the substrate 103 and damage to the mold 102. In this embodiment, detection processing is performed by comparing the image obtained by the image capturing unit 109 in a state in which the mold 102 and the resin material on the substrate 103 are in contact with each other while performing the imprint process, that is, the image shown in FIG. 2C or 2D with the reference image. Note that the reference image is an image obtained in a state in which the mold 102 and the resin material on the substrate 103 are in contact with each other without sandwiching the foreign particle.

Detection processing in this embodiment will be described in detail with reference to FIG. 3. A reference mark 3a shows a reference image. A reference mark 3b shows an image (captured image) obtained by the image capturing unit 109 in the state in which the mold 102 and the resin material on the substrate 103 are in contact with each other. The captured image shown in the reference mark 3b corresponds to the image shown in FIG. 2C or 2D and is an image obtained in a state in which a foreign particle is sandwiched between the mold 102 and the substrate 103. A reference mark 3c is a difference image showing the difference between the reference image shown in the reference mark 3a of FIG. 3 and the captured image shown in the reference mark 3b of FIG. 3. Referring to the reference mark 3c of FIG. 3, the foreign particle sandwiched between the mold 102 and the substrate 103 is extracted as the difference (black dot) between the reference image and the captured image. As described above, it is possible to detect the foreign particle present between the mold 102 and the substrate 103 by comparing the reference image with the captured image.

The image (captured image) captured by the image capturing unit 109 in the state in which the mold 102 and the resin material on the substrate 103 are in contact with each other while performing the imprint process has been described here as the image shown in FIG. 2C or 2D. Note that the image obtained in a state in which the concave portion of the pattern surface of the mold 102 is not filled with the resin material, that is, the image shown in FIG. 2C includes the bubbles as described above. Therefore, when the difference between the reference image and the image shown in FIG. 2C is calculated, the bubbles may be extracted and erroneously detected as foreign particles. When the bubbles may be erroneously detected as the foreign particles as described above, the image obtained in the state in which the concave portion of the pattern surface of the mold 102 is filled with the resin material, that is, the image shown in FIG. 2D can be compared with the reference image. In other words, the image obtained in the state in which the concave portion of the pattern surface of the mold 102 is filled with the resin material has a small change caused by a factor other than the foreign particle and can detect the foreign particle most stably in detection processing. Note that in general, it takes about two to three sec until the concave portion of the pattern surface of the mold 102 is filled with the resin material on the substrate 103 after bringing the mold 102 and the resin material into contact with each other. Therefore, in order to obtain the image in the state in which the concave portion of the pattern surface of the mold 102 is filled with the resin material, the image capturing unit 109 can be caused to obtain the image after a lapse of a predetermined time (for example, two to three sec) from time when the mold 102 and the resin material on the substrate 103 are brought into contact with each other.

Detection processing has been described above when the captured image obtained by the image capturing unit 109 indicates not a peripheral shot region (edge shot) having the periphery of the substrate 103 but a shot region inside the peripheral shot region. However, when the captured image obtained by the image capturing unit 109 indicates the peripheral shot region, the captured image includes a region outside of the substrate 103 as shown in a reference mark 4b of FIG. 4. The peripheral shot region will be referred to as a partial field and the shot region inside the peripheral shot region will be referred to as a full field, hereinafter. When comparing a captured image corresponding to the partial field as shown in the reference mark 4b FIG. 4 with a reference image corresponding to the full field as shown in a reference mark 4a of FIG. 4, the region outside the substrate is extracted and erroneously detected as a foreign particle as shown in a reference mark 4c of FIG. 4.

To prevent this, in this embodiment, when the captured image obtained by the image capturing unit 109 includes the region outside of the substrate 103, the region outside the substrate is excluded from a target of detection processing. It is possible to specify, based on the distance between the center position of the substrate 103 and a position on the substrate 103 corresponding to the center of the captured image obtained by the image capturing unit 109, whether the captured image includes the region outside the substrate.

The substrate 103 basically has a circular shape. It is therefore possible to prevent a region outside of a radius R (region outside the substrate) from the center position of the substrate 103 from being erroneously detected as a foreign particle by excluding the region outside the substrate from the target of detection processing as shown in FIG. 5. More specifically, let the region outside the substrate be the region outside of the radius R relative to the center position of the substrate 103. For example, letting (X, Y) be the center coordinates of the shot region relative to the center position of the substrate 103 and (x, y) be respective coordinates from the center coordinates of the shot region, a region on a condition given by:
[Math.1]

$$R < \sqrt{(X+x)^2 + (Y+y)^2} \quad (1)$$

is excluded from the target of detection processing as the region outside the substrate. In FIG. 5, a region shown in gray becomes a region excluded from the target of detection processing.

When the captured image obtained by the image capturing unit 109 is the partial field as described above, it is possible to prevent the region outside the substrate from being erroneously detected as the foreign particle by excluding the region outside the substrate from the target of detection processing as shown in FIG. 6. A reference mark 6a of FIG. 6 shows a reference image corresponding to the full field. A reference mark 6b of FIG. 6 shows an image (captured image) obtained by the image capturing unit 109 in the state in which the mold 102 and the resin material on the substrate 103 are in contact with each other. The captured image shown in the reference mark 6b of FIG. 6 is an image obtained in a state in which a foreign particle is sandwiched between the mold 102 and the substrate 103 in the partial field. A reference mark 6c of FIG. 6 is a difference image showing the difference between the reference image shown in the reference mark 6a of FIG. 6 and the captured image shown in the reference mark 6b of FIG. 6. Referring to the reference mark 6c of FIG. 6, the foreign particle sandwiched between the mold 102 and the substrate 103 is extracted as the difference (black dot) between the reference image and the captured image. It is possible, however, to correctly detect only the foreign particle present between the mold 102 and the substrate 103 without detecting a region outside the substrate (region shown in gray) as a foreign particle because the region outside the substrate has been excluded from the target of detection processing.

When excluding the region outside the substrate from the target of detection processing, data regarding the region outside the substrate in the captured image may be deleted before obtaining the difference image by comparing the reference image with the captured image or data regarding the region outside the substrate in the difference image may be ignored after obtaining the difference image.

When a captured image obtained by the image capturing unit 109 is a shot region having a notch, the captured image has the notch as shown in FIG. 7A. When comparing the captured image corresponding to the shot region having the notch as shown in FIG. 7A with the reference image (the reference mark 6a of FIG. 6) corresponding to the full field, the notch is erroneously detected as a foreign particle like the region outside the substrate. The notch is a cut indicating the crystal orientation of a silicon wafer.

To prevent this, in this embodiment, information on the substrate 103 is obtained, and then the region where the notch has been formed on the substrate 103 obtained from the information is excluded from the target of detection processing. This makes it possible to prevent the region where the notch has been formed on the substrate 103 from being erroneously detected as the foreign particle as shown in FIG. 7B. FIG. 7B is a difference image showing the difference between the reference image (the reference mark 6a of FIG. 6) and the captured image shown in FIG. 7A. Referring to FIG. 7B, it is possible to correctly detect only the foreign particle present between the mold 102 and the substrate 103 without detecting the region where the notch has been formed (region shown in gray) as the foreign particle because the region has been excluded from the target of detection processing.

As described above, the region where the notch has been formed is preferably excluded from detection processing even if the region is a region inside the substrate (region inside of the radius R). This also applies to a region where an orientation flat has been formed on the substrate.

Also, in order to reduce a time required for detection processing and to increase throughput (productivity), for example, a region not used as an IC chip on the substrate is set in advance and the region may be excluded from detection processing. In this case, the processing unit 114 is caused to function as a setting unit which sets a region on the substrate in accordance with a user input and the region is excluded from the target of detection processing.

The imprint apparatus 100 of this embodiment detects the foreign particle present between the mold 102 and the substrate 103 while performing the imprint process. Therefore, the imprint apparatus 100 can reduce occurrence of the defect in the pattern formed on the substrate 103 and damage to the mold 102. In this embodiment, it is also possible detect, by excluding the region outside the substrate 103 from the target of detection processing, the foreign particle present between the mold 102 and the substrate 103 using the reference image corresponding to the full field even if the captured image is the partial field.

Second Embodiment

In the first embodiment, a case has been described in which detection processing is performed using the reference image corresponding to the full field even if the captured image obtained by the image capturing unit 109 is the partial field. In this embodiment, a case will be described in which a reference image to be used in detection processing, that is, compared with a captured image is changed depending on a shot region of a substrate.

In this embodiment, a storage unit 113 stores a reference image corresponding to each shot region of a substrate 103. On the other hand, a processing unit 114 selects a reference image corresponding to the shot region of the captured image from the plurality of reference images stored in the storage unit 113 when performing detection processing of detecting a foreign particle present between a mold 102 and the substrate 103. Then, the processing unit 114 detects the foreign particle present between the mold 102 and the substrate 103 by comparing the captured image with the selected reference image, as in the first embodiment.

The storage unit 113 may store not the reference images with respect to all the shot regions of the substrate 103 but the first reference image corresponding to each partial field and the second reference image corresponding to at least one full field. When the captured image is the partial field, the foreign particle present between the mold 102 and the substrate 103 is detected by comparing the captured image with the first reference image corresponding to the partial field. When the captured image is the full field, the foreign particle present between the mold 102 and the substrate 103 is detected by comparing the captured image with the second reference image.

More specifically, when a captured image obtained by an image capturing unit 109 is a partial field, detection processing is performed using a reference image corresponding to the partial field, as shown in FIG. 8. A reference mark 8a of FIG. 8 shows the reference image corresponding to the partial field. A reference mark 8b of FIG. 8 shows the image (captured image) obtained by the image capturing unit 109 in a state in which the mold 102 and a resin on the substrate 103 are in contact with each other. The captured image shown in the reference mark 8b of FIG. 8 is an image obtained in a state in which a foreign particle is sandwiched between the mold 102 and the substrate 103 in the partial field. A reference mark 8c of FIG. 8 is a difference image showing the difference between the reference image shown in the reference mark 8a of FIG. 8 and the captured image shown in the reference mark 8b of FIG. 8. Referring to the reference mark 8c of FIG. 8, the foreign particle sandwiched between the mold 102 and the substrate 103 is extracted as the difference (black dot) between the reference image and the captured image. It is possible to correctly detect only the foreign particle present between the mold 102 and the substrate 103 without detecting a region outside the substrate 103 as a foreign particle because the reference image corresponds to the partial field.

The state of an imprint apparatus 100, and more specifically, the state of a region outside of a substrate chuck 108 (the region outside the substrate) arranged on a substrate stage 104 may be different between times when the reference image is obtained and when the captured image is obtained. In this case, this embodiment and the first embodiment can be combined as shown in FIG. 9. A reference mark 9a of FIG. 9 shows a reference image corresponding to the partial field. A reference mark 9b of FIG. 9 shows an image (captured image) obtained by the image capturing unit 109 in the state in which the mold 102 and the resin on the substrate 103 are in contact with each other. The captured image shown in the reference mark 9b of FIG. 9 is an image obtained in a state in which a foreign particle is sandwiched between the mold 102 and the substrate 103 in the partial field. A reference mark 9c of FIG. 9 is a difference image showing the difference between the reference image shown in the reference mark 9a of FIG. 9 and the captured image shown in the reference mark 9b of FIG. 9. Referring to the reference mark 9c of FIG. 9, the foreign particle sandwiched between the mold 102 and the substrate 103 is extracted as the difference (black dot) between the reference image and the captured image. However, it is possible, even if the state of the region outside the substrate 103 (a region shown in gray) changes, to correctly detect only the foreign particle present between the mold 102 and the substrate 103 without detecting the change as a foreign particle because the region outside the substrate 103 has been excluded from a target of detection processing.

Third Embodiment

A method of manufacturing a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus 100. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-082856 filed on Apr. 14, 2015, which is hereby incorporated by reference herein in its entirety.

The invention claimed is:

1. An imprint apparatus which forms a pattern of an imprint material on a substrate using a mold, the apparatus comprising:
   an image capturing unit configured to obtain an image by capturing a shot region on the substrate; and
   a processing unit configured to:
      detect a foreign particle in a region in which the mold and the imprint material are in contact with each other using an image obtained by the image capturing unit in a state in which the mold and the imprint material on the shot region are in contact with each other, and a reference image corresponding to a shot region not including a periphery of the substrate; and
      cease an imprint process of forming the pattern when the foreign particle in the region in which the mold and the imprint material are in contact with each other is detected,
   wherein the processing unit is further configured to
      detect, in a case where the image obtained by the image capturing unit includes an image of a shot region not including the periphery of the substrate, the foreign particle in the region in which the mold and the imprint material are in contact with each other using a difference image between the image obtained by the image capturing unit and the reference image, and
      detect, in a case where the image obtained by the image capturing unit includes an image of a shot region including the periphery of the substrate, the foreign particle in the region in which the mold and the imprint material are in contact with each other using a difference image between an image excluding an image of a region outside the substrate from the image obtained by the image capturing unit and the reference image, or a difference image excluding a difference image between an image of a region outside the substrate and the reference image from a difference image between the image obtained by the image capturing unit and the reference image.

2. The apparatus according to claim 1, wherein the state in which the mold and the imprint material are in contact with each other is a state in which a concave portion of a pattern surface of the mold is filled with the imprint material.

3. The apparatus according to claim 1, wherein the processing unit is further configured to cause the image capturing unit to obtain the image, in the state in which the mold and the imprint material are in contact with each other, after a lapse of a predetermined time from a time when the mold and the imprint material are brought into contact with each other.

4. The apparatus according to claim 1, wherein the reference image is an image obtained in a state in which the mold and the imprint material on the substrate are in contact with each other without sandwiching the foreign particle.

5. The apparatus according to claim 1, wherein the processing unit is further configured to release the mold from the imprint material without curing the imprint material when the foreign particle in the region in which the mold and the imprint material are in contact with each other is detected.

6. The apparatus according to claim 1, wherein the processing unit is further configured to specify, based on a distance between a position on the substrate corresponding to a center of the image obtained by the image capturing unit and a center position of the substrate, whether the image obtained by the image capturing unit includes the image of the region outside the substrate.

7. The apparatus according to claim 1, wherein the processing unit is further configured to obtain information on the substrate and exclude a region of a notch or an orientation flat formed on the substrate obtained from the information from a target of foreign particle detection.

8. The apparatus according to claim 1, further comprising a setting unit configured to set a region on the substrate in accordance with a user input,
wherein the processing unit is further configured to exclude the region set by the setting unit from a target of foreign particle detection.

9. A method of manufacturing an article, the method comprising:
forming a pattern on a substrate using an imprint apparatus according to claim 1; and
processing the substrate on which the pattern has been formed.

10. An imprint apparatus which forms a pattern of an imprint material on a substrate using a mold, the apparatus comprising:
an image capturing unit configured to obtain an image by capturing a shot region on the substrate; and
a processing unit configured to:
generate a difference image between an image obtained by the image capturing unit in a state in which the mold and the imprint material on the shot region are in contact with each other and a reference image corresponding to a shot region not including a periphery of the substrate;
detect a foreign particle in a region in which the mold and the imprint material are in contact with each other using the difference image; and
cease an imprint process of forming the pattern when the foreign particle in the region in which the mold and the imprint material are in contact with each other is detected,
wherein the processing unit is further configured to use, in a case where the image obtained by the image capturing unit includes an image of a region outside the substrate, as the difference image, a difference image between an image excluding the image of the region outside the substrate from the image obtained by the image capturing unit and the reference image.

11. A method of manufacturing an article, the method comprising:
forming a pattern on a substrate using an imprint apparatus according to claim 10; and
processing the substrate on which the pattern has been formed.

12. An imprint apparatus which forms a pattern of an imprint material on a substrate using a mold, the apparatus comprising:
an image capturing unit configured to obtain an image by capturing a shot region on the substrate; and
a processing unit configured to:
generate a difference image between an image obtained by the image capturing unit in a state in which the mold and the imprint material on the shot region are in contact with each other and a reference image corresponding to a shot region not including a periphery of the substrate;
detect a foreign particle in a region in which the mold and the imprint material are in contact with each other using the difference image; and
cease an imprint process of forming the pattern when the foreign particle in the region in which the mold and the imprint material are in contact with each other is detected,
wherein the processing unit is further configured to detect, in a case where the image obtained by the image capturing unit includes an image of a region outside the substrate, the foreign particle in the region in which the mold and the imprint material are in contact with each other without using a difference image between the image of the region outside the substrate and the reference image.

13. A method of manufacturing an article, the method comprising:
forming a pattern on a substrate using an imprint apparatus according to claim 12; and
processing the substrate on which the pattern has been formed.

* * * * *